United States Patent
Kao

(10) Patent No.: US 8,383,448 B2
(45) Date of Patent: Feb. 26, 2013

(54) METHOD OF FABRICATING METAL OXIDE SEMICONDUCTOR DEVICE

(75) Inventor: Ching-Hung Kao, Hsinchu Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/343,724

(22) Filed: Jan. 5, 2012

(65) Prior Publication Data

US 2012/0108000 A1     May 3, 2012

Related U.S. Application Data

(62) Division of application No. 11/738,836, filed on Apr. 23, 2007, now abandoned.

(51) Int. Cl.
*H01L 21/00*     (2006.01)
*H01L 21/339*     (2006.01)
*H01L 27/148*     (2006.01)

(52) U.S. Cl. .......... 438/75; 438/60; 438/144; 438/145; 438/146; 438/148; 257/214; 257/215; 257/233; 257/239; 257/291; 257/292; 257/293; 257/E27.122; 257/E27.132; 257/E27.133

(58) Field of Classification Search .......... 257/291–293, 257/E27.132, E27.133, 214, 215, 233, 239, 257/E27.122; 438/581, 583, 682, 60, 75, 438/144–148

See application file for complete search history.

(56) References Cited

U.S. PATENT DOCUMENTS

| | | | |
|---|---|---|---|
| 6,040,592 A | 3/2000 | McDaniel | |
| 6,040,593 A | 3/2000 | Park | |
| 6,071,826 A | 6/2000 | Cho | |
| 6,316,304 B1 * | 11/2001 | Pradeep et al. | 438/230 |
| 6,642,087 B2 * | 11/2003 | Nozaki et al. | 438/149 |
| 6,900,507 B1 | 5/2005 | Hong | |
| 6,930,299 B2 | 8/2005 | Ohkawa | |
| 7,531,374 B2 | 5/2009 | Kao | |
| 2003/0234432 A1 * | 12/2003 | Song et al. | 257/440 |
| 2004/0046193 A1 * | 3/2004 | Park et al. | 257/292 |
| 2004/0252212 A1 | 12/2004 | Ohkawa | |

* cited by examiner

*Primary Examiner* — S. V. Clark
*Assistant Examiner* — Jesse Y Miyoshi
(74) *Attorney, Agent, or Firm* — Winston Hsu; Scott Margo

(57) ABSTRACT

A method of fabricating an MOS device is provided. First, gates and source/drain regions of transistors are formed on a substrate. A photodiode doped region and a floating node doped region are formed in the substrate. Thereafter, a spacer stacked layer including a bottom layer, an inter-layer and a top layer is formed to cover each gate of the transistors. Afterwards, a first mask layer having an opening exposing at least the photodiode doped region is formed on the substrate, and then the top layer exposed by the opening is removed. Next, the first mask layer is removed, and then a second mask layer is formed on a region correspondingly exposed by the opening. A portion of the top layer and the inter-layer exposed by the second mask layer is removed to form spacers on sidewalls of the gates.

8 Claims, 13 Drawing Sheets

METHOD OF FABRICATING METAL OXIDE SEMICONDUCTOR DEVICE

CROSS REFERENCE TO RELATED APPLICATIONS

This is a divisional application of U.S. patent application Ser. No. 11/738,836 filed on Apr. 23, 2007, and the contents of which are entirely included herein by reference.

BACKGROUND OF THE INVENTION

1. Field of the Invention

The present invention relates to an integrated circuit and a method of fabricating the same, and more particularly to a metal oxide semiconductor (MOS) device and a method of fabricating the same.

2. Description of the Prior Art

The process of forming a complementary metal oxide semiconductor (CMOS) image sensor is compatible to the process of forming a CMOS transistor. Consequently, the CMOS image sensor can be fabricated with other peripheral circuits on a same chip. Thus, the power consumption and the costs of fabricating the image sensors are significantly reduced. In the recent years, the CMOS image sensor has replaced a charge-coupled device (CCD) in the low-end application and become more and more predominant.

The CMOS image sensor includes a photodiode and a plurality of transistors. The photodiode is constructed by a P-N junction constituted of an N-doped region and a P-substrate. The transistors are N-type MOS transistors having N-type gates (N-poly NMOSs). Currently, the CMOS image sensor includes a 3-transistor (3-T) configuration and a 4-transistor (4-T) configuration.

A typical 3-T configuration refers to the CMOS image sensor including a reset transistor, a source follower transistor, a select transistor, and a photodiode. However, the 3-T configuration brings about high dark current, increases read-out noises and adversely affects the image quality, thus reducing the performance of the devices. Hence, the 4-T configuration is implemented more frequently.

FIG. 1 schematically illustrates a conventional 4-T CMOS image sensor.

In FIG. 1, the CMOS image sensor includes a substrate 100, a transfer transistor 102 disposed on the substrate 100, a reset transistor 104, a source follower transistor 106, a select transistor 108, a photodiode 110 disposed in the substrate 100, a floating node 112 disposed in the substrate 100, and a P-well 114 disposed in the substrate 100. Since the 4-T CMOS image sensor includes the transfer transistor 102, the high dark current of the 3-T CMOS image sensor can be avoided.

In the 4-T CMOS image sensor, the spacer material deposited on the photodiode region is frequently kept, so as to protect the photodiode region from being damaged during the etching and the formation of the spacers and to avoid the dark current from increasing. Generally, the thickness of the spacers exceeds 1000 angstroms, and the spacers are often made of silicon nitride. Thereby, excessive silicon nitride is left in the photodiode region, which blocks lights emitting into the photodiode region and impairs the sensitivity of the sensor. On the contrary, if the spacers are made of silicon oxide, a subsequently formed anti-reflective layer is disposed far away from the photodiode region due to the excessive thickness of silicon oxide. Hence, the reflection cannot be effectively suppressed.

SUMMARY OF THE INVENTION

The present invention is directed to an MOS device and a method of fabricating the same, protecting a photodiode region from being damaged during the etching and the formation of spacers and further avoiding a dark current from increasing.

The present invention is directed to an MOS device and a method of fabricating the same. Thereby, the sensitivity of a CMOS image sensor can be enhanced.

The present invention is directed to an MOS device and a method of fabricating the same, which can effectively prevent reflectivity.

The present invention provides a method of fabricating an MOS device. The method includes first providing a substrate including a CMOS image sensor region and a non-CMOS image sensor region. A plurality of gates and source/drain regions of transistors are then formed on the substrate, and a photodiode doped region and a floating node doped region are formed in the CMOS image sensor region. Next, a spacer stacked layer covering the gate of each of the transistors is formed on the substrate. The spacer stacked layer at least includes a bottom layer, an inter-layer, and a top layer from bottom to top. Thereafter, a first mask layer is formed on the substrate. The first mask layer has an opening which exposes at least the photodiode doped region and is extended to a part of the transistor adjacent to the photodiode doped region. Afterwards, a removing process is performed to remove the top layer exposed by the opening. The first mask layer is removed. A second mask layer is then formed on a region correspondingly exposed by the opening. After that, a portion of the top layer and the inter-layer exposed by the second mask layer is removed to form a spacer on a sidewall of each of the transistors. Next, the second mask layer is removed. Thereafter, a salicide block (SAB) layer is formed on the substrate, and a portion of the top layer, the inter-layer, and the bottom layer is removed with use of the SAB layer as an etching mask so as to expose a plurality of predetermined regions. Finally, a metal silicide layer is formed on each of the predetermined regions.

According to one embodiment of the present invention, the materials of the bottom layer/the inter-layer/the top layer include silicon oxide/silicon nitride/silicon oxide.

According to one embodiment of the present invention, the thicknesses of silicon oxide/silicon nitride/silicon oxide are 300-500 angstroms/100-300 angstroms/300-700 angstroms.

According to one embodiment of the present invention, the removing process further includes removing the inter-layer disposed below the opening.

According to one embodiment of the present invention, the materials of the bottom layer/the inter-layer/the top layer include silicon oxide/silicon nitride/silicon oxide.

According to one embodiment of the present invention, the thicknesses of silicon oxide/silicon nitride/silicon oxide are 100-300 angstroms/100-300 angstroms/300-700 angstroms.

According to one embodiment of the present invention, the opening exposes the photodiode doped region, the floating node doped region, the transistor adjacent to the photodiode doped region, and a part of the transistor adjacent to the floating node doped region.

According to one embodiment of the present invention, the removing process further includes removing the inter-layer disposed below the opening.

According to one embodiment of the present invention, the opening exposes the whole CMOS image sensor region.

According to one embodiment of the present invention, the removing process further includes removing the inter-layer disposed below the opening.

According to one embodiment of the present invention, the first mask layer includes a patterned photoresist layer.

According to one embodiment of the present invention, the second mask layer includes a patterned photoresist layer.

According to one embodiment of the present invention, the material of the SAB layer is selected from one of the groups consisting of silicon nitride, SiON, silicon oxide and a combination thereof.

The present invention further provides an MOS device disposed on a substrate including a CMOS image sensor region and a non-CMOS image sensor region. The MOS device includes a CMOS image sensor disposed in the CMOS image sensor region and a second transistor disposed in the non-CMOS image sensor region. The CMOS image sensor includes a photodiode doped region, a plurality of first transistors, at least a bottom layer, an SAB layer, and a floating node doped region. The photodiode doped region is disposed in the substrate. The first transistors disposed on the substrate include a transfer transistor, a reset transistor, a source follower transistor and a select transistor. The transfer transistor is adjacent to the photodiode doped region, and at least a sidewall of a gate of the transfer transistor adjacent to the photodiode doped region has no spacers. The floating node doped region is disposed in the substrate between the transfer transistor and the reset transistor. The bottom layer covers a surface of the transistors having no spacers, a surface of the photodiode doped region, and a surface of the floating node doped region. The SAB layer covers the bottom layer.

According to one embodiment of the present invention, the MOS device further includes an inter-layer at least disposed between the SAB layer and the bottom layer over the photodiode doped region.

According to one embodiment of the present invention, the material of the inter-layer is different from the material of the bottom layer.

According to one embodiment of the present invention, the spacers at respective sidewalls of at least one of the first transistors are differently shaped.

According to one embodiment of the present invention, said first transistor having the differently-shaped spacers at the respective sidewalls is the reset transistor.

According to one embodiment of the present invention, the MOS device further includes a liner layer disposed between the spacers and the first transistors. The spacers include an outer spacer and an inner spacer.

According to one embodiment of the present invention, the material of the outer spacers includes silicon oxide, while the material of the inner spacers includes silicon nitride.

According to one embodiment of the present invention, the inter-layer is disposed between the bottom layer and the SAB layer over the photodiode doped region, the transfer transistor, the floating node doped region and a part of the reset transistor.

According to one embodiment of the present invention, the spacers of the first transistors and the spacer of the second transistor are equally shaped.

According to one embodiment of the present invention, the spacer on a sidewall of at least one of the first transistors and the spacer of the second transistor are differently shaped.

According to one embodiment of the present invention, both sidewalls of the gate of the transfer transistor and a sidewall of the gate of the reset transistor adjacent to the transfer transistor comprise no spacers.

According to one embodiment of the present invention, the spacer of at least one of the first transistors and a spacer of the second transistor are differently shaped.

According to one embodiment of the present invention, the spacers at the respective sidewalls of at least one of the first transistors are differently shaped.

According to one embodiment of the present invention, said first transistor having the differently-shaped spacers at the respective sidewalls is the reset transistor.

According to one embodiment of the present invention, the MOS device further includes a liner layer disposed between the spacers of the first transistors and the gates. The spacers include an outer spacer and an inner spacer.

According to one embodiment of the present invention, the material of the outer spacers includes silicon oxide, while the material of the inner spacers includes silicon nitride.

According to one embodiment of the present invention, the spacers of the first transistors and the spacer of the second transistor are equally shaped.

According to one embodiment of the present invention, the spacers of the first transistors and the spacer of the second transistor are double-layered spacers, respectively.

According to one embodiment of the present invention, both sidewalls of the gate of the transfer transistor and a sidewall of the gate of the reset transistor adjacent to the transfer transistor include no spacers.

According to one embodiment of the present invention, all of the first transistors have no spacers.

According to one embodiment of the present invention, the MOS device further includes a liner layer disposed on each of the sidewalls of the gates of the first transistors.

According to one embodiment of the present invention, the material of the bottom layer includes silicon oxide.

The MOS device and the method of fabricating the same disclosed in the present invention can prevent the photodiode region from being damaged during the etching and the formation of the spacers and further avoid the dark current from increasing.

The MOS device and the method of fabricating the same disclosed in the present invention are able to enhance the sensitivity of the CMOS image sensor.

The MOS device and the method of fabricating the same disclosed in the present invention are capable of effectively suppressing the reflection.

In order to the make the aforementioned and other objects, features and advantages of the present invention comprehensible, several embodiments accompanied with figures are described in detail below.

DETAILED DESCRIPTION

First Embodiment

FIGS. 2A through 2D are cross-sectional flow charts schematically illustrating a process of fabricating of an MOS device according to an embodiment of the present invention.

Figure 1:
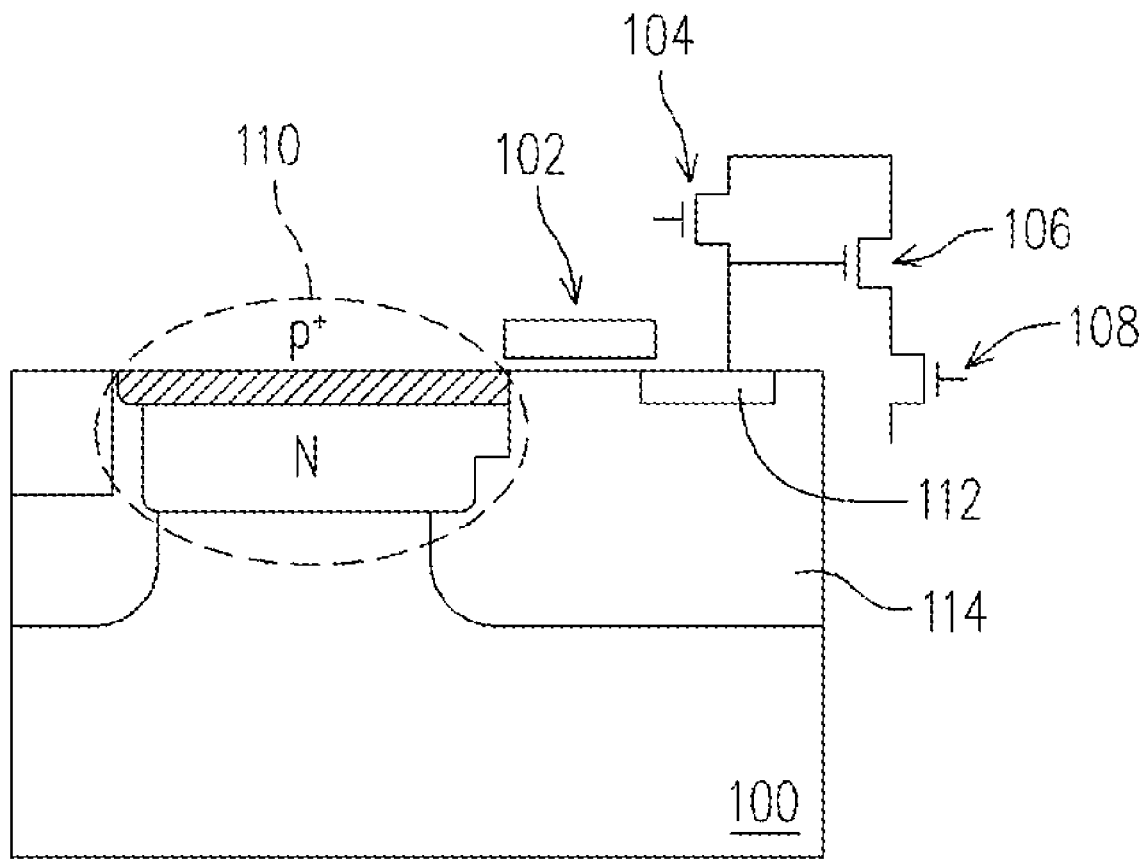
FIG. 1 schematically illustrates a conventional 4-T CMOS image sensor.
Figure 2A:
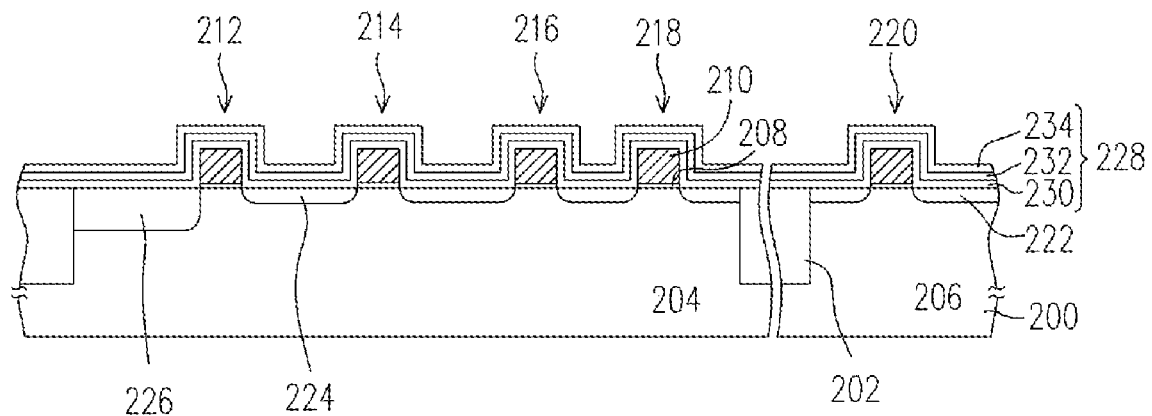
FIGS. 2A through 2D are cross-sectional flow charts schematically illustrating a process of fabricating of an MOS device according to an embodiment of the present invention.

Referring to FIG. 2A, a substrate 200 is provided. The substrate 200 is, for example, a semiconductor substrate such as a silicon substrate. First, an isolation structure 202 is formed in the substrate 200 to define active regions 204 and 206. The active region 204 is a CMOS image sensor region, and the active region 206 is a non-CMOS image sensor region. The isolation structure 202 is formed by performing a shallow trench isolation method or a localized oxidation isolation method. Then, a P-type filed region (not shown) is formed at the periphery and on the bottom of the isolation structure 202.

Next, a transfer resistor 212, a reset transistor 214, a source follower transistor 216, a select transistor 218, a floating node doped region 224, and a photodiode doped region 226 are formed in the CMOS image sensor region 204 of the substrate 200. In addition, a transistor 220 is formed in the non-CMOS image sensor region 206. The transfer resistor 212, the reset transistor 214, the source follower transistor 216, the select transistor 218 and the transistor 220 all include gate dielectric layers 208, gates 210, and source/drain extension regions 222. The material of the gate dielectric layers 208 is, for example, silicon oxide, and the method of forming the gate dielectric layers 208 includes performing a thermal oxidation process, for example. The material of the gates 210 is polysilicon, for example, and the method of forming the gates 210 includes performing a chemical vapor deposition (CVD) process, for example. The source/drain extension regions 222 may be constructed by performing ion implantation processes.

Thereafter, a spacer stacked layer 228 is formed on the substrate 200. The spacer stacked layer 228 includes a bottom layer 230, an inter-layer 232 and a top layer 234. The etching rate of the inter-layer 232 is different from that of the bottom layer 230 and the top layer 234. In one embodiment, the materials of the bottom layer 230/the inter-layer 232/the top layer 234 include silicon oxide/silicon nitride/silicon oxide, for example, and the thicknesses thereof are 300-500 angstroms/100-300 angstroms/300-700 angstroms. The method of forming the bottom layer 230/the inter-layer 232/the top layer 234 includes performing the CVD process, for example.

Figure 2B:
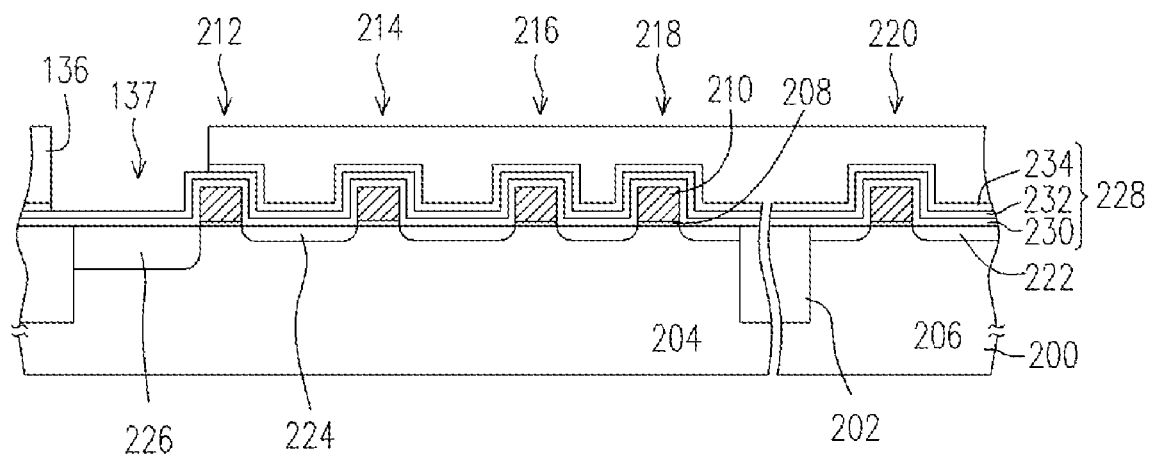

Thereafter, referring to FIG. 2B, a mask layer 136 is formed on the top layer 234. The mask layer 136 has an opening 137 which exposes the photodiode doped region 226 and is extended to a part of the gate 208 of the transfer transistor 212 adjacent to the photodiode doped region 226. The mask layer 136 is, for example, a patterned photoresist layer, and the method of forming the mask layer 136 includes coating photoresist, performing an exposure process, and implementing a development process.

After that, the top layer 234 exposed by the opening 137 is removed with use of the mask layer 136 as a hard mask, such that the inter-layer 232 below the top layer 234 is exposed. The method of removing the top layer 234 may be a dry etching method or a wet etching method. In one embodiment, the materials of the bottom layer 230/the inter-layer 232/the top layer 234 include silicon oxide/silicon nitride/silicon oxide. The remained inter-layer 232 may be employed as an anti-reflective layer. And the stress arisen from the remained inter-layer 232 may be cushioned through the bottom layer 230 in the thickness of 300-500 angstroms.

Figure 2C:
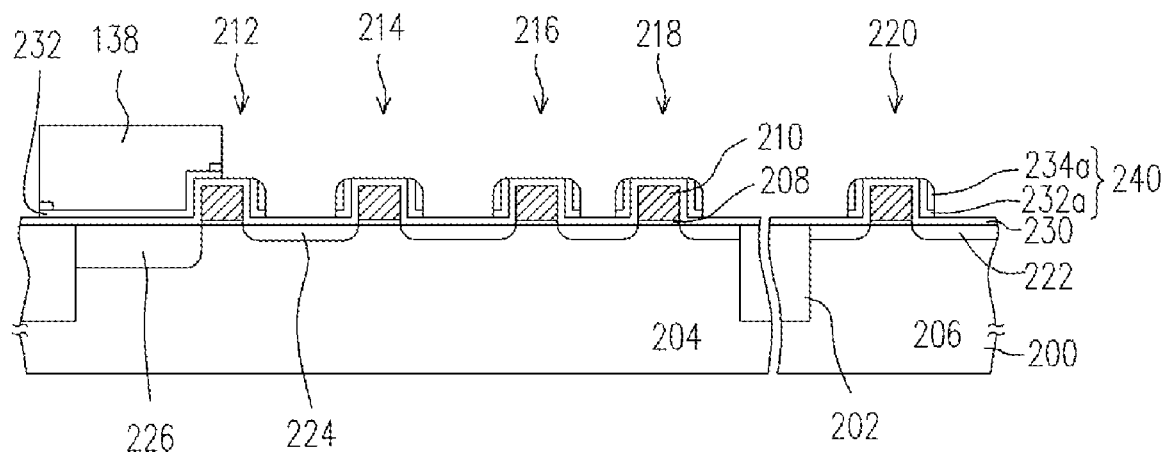

Afterwards, referring to FIG. 2C, the mask layer 136 is removed. Another mask layer 138 is then formed on a region correspondingly exposed by the opening 137, such that the photodiode doped region 226 and a part of the gate 208 of the transfer transistor 212 are covered while other regions are exposed. The mask layer 138 is, for example, a patterned photoresist layer, and the method of forming the mask layer 138 includes coating photoresist, performing the exposure process, and implementing the development process.

Next, an anisotropic etching operation is performed with use of the mask layer 138 as the mask to remove a portion of the top layer 234 and the inter-layer 232 exposed by the mask layer 138, such that spacers 240 are formed at a sidewall of the transfer transistor 212 and at both sidewalls of the reset transistor 214, the source follower transistor 216, the select transistor 218, and the transistor 220. Each of the spacers 240 is constructed by an inner spacer 232a formed by the inter-layer 232 and an outer spacer 234a formed by the top layer 234. The anisotropic etching operation is a plasma etching process, for example. During the etching process, the photodiode doped region 226 is covered by the mask layer 138, and thus the photodiode doped region 226 is not damaged.

Figure 2D:
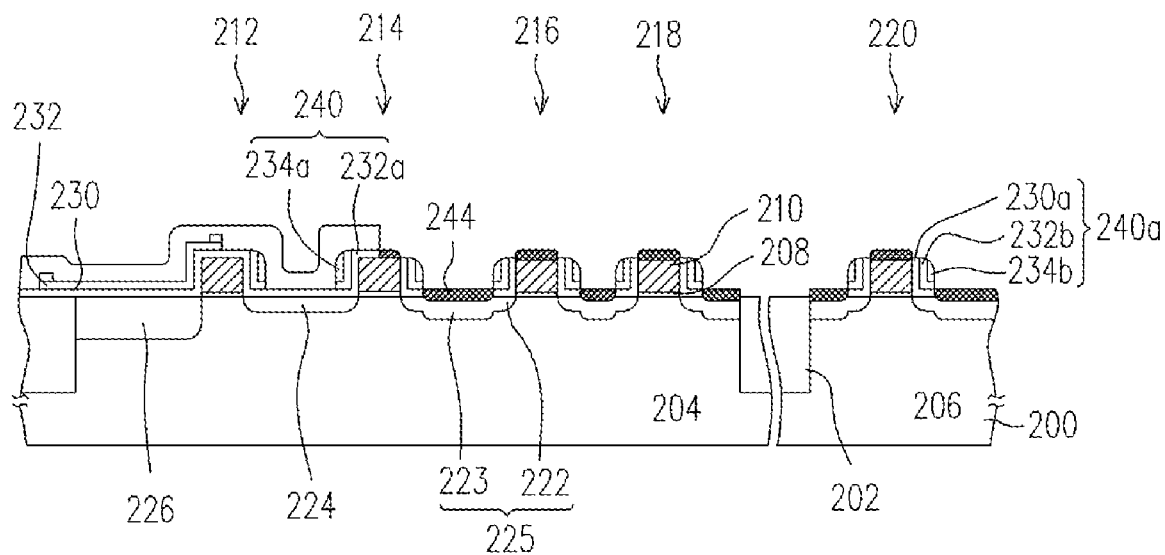

Thereafter, as shown in FIG. 2D, the mask layer 138 is removed. After that, the ion implantation process may be performed to form source/drain contact regions 223 in the substrate 200. The source/drain contact regions 223 and the source/drain extension regions 222 together form source/drain regions 225. Afterwards, an salicide block (SAB) layer 242 is formed on the substrate 200, and the bottom layer 230 exposed by the SAB layer 242 is etched and removed, such that predetermined regions in which a metal silicide layer to be formed are exposed. The material of the SAB layer 242 is, for example, silicon nitride, SiON, or silicon oxide, and the method of forming the SAB layer 242 includes performing the CVD process or a high-temperature oxidation (HTO) process, for example. In one embodiment, the SAB layer 242 covers the photodiode doped region 226, the transfer transistor 212, the floating node doped region 224, and a part of the gate 210 of the reset transistor 214. During the etching process, the spacers 240 of the transfer transistor 212 and of the reset transistor 214 both covered by the SAB layer 242 are left. And the spacers 240 of the reset transistor 214, of the source follower transistor 216, of the select transistor 218 and of the transistor 220 all exposed by the SAB layer 242 are partially etched to form spacers 240a composed of inner spacers 232b and outer spacers 234b. A liner layer 230a sandwiched between one of the spacers 240a and the gates 210 is left after the bottom layer 230 is etched. Next, a salicide process is performed to form a metal silicide layer 244 on the gates 210 and on the source/drain regions 225 both exposed by the SAB layer 242. The metal silicide layer 244 is formed by, for example, forming a metal layer on the substrate 200 at first. The metal used for fabricating the metal layer may be a refractory metal selected from one of the groups consisting of nickel, cobalt, titanium, copper, molybdenum, tantalum, tungsten, erbium, zirconium, platinum and an alloy including one or more of said metals. Afterwards, an annealing process is performed to enable the silicon in the substrate 200 or in the gates 210 to react with the metal layer and to form a metal silicide having a lower resistance. Thereafter, the unreacted metal layer is removed.

Thereafter, the successive processes are performed. Since the subsequent processes are well known to people skilled in the art, detailed descriptions are omitted herein.

In the above fabrication process, a passivation layer (not shown) may be alternatively formed on a surface of the photodiode doped region 226 so as to prevent current leakage. The passivation layer is, for example, a P-doped region.

Second Embodiment

FIGS. 3A through 3D are cross-sectional flow charts schematically illustrating a process of fabricating of another MOS device according to an embodiment of the present invention.

Figure 3A:
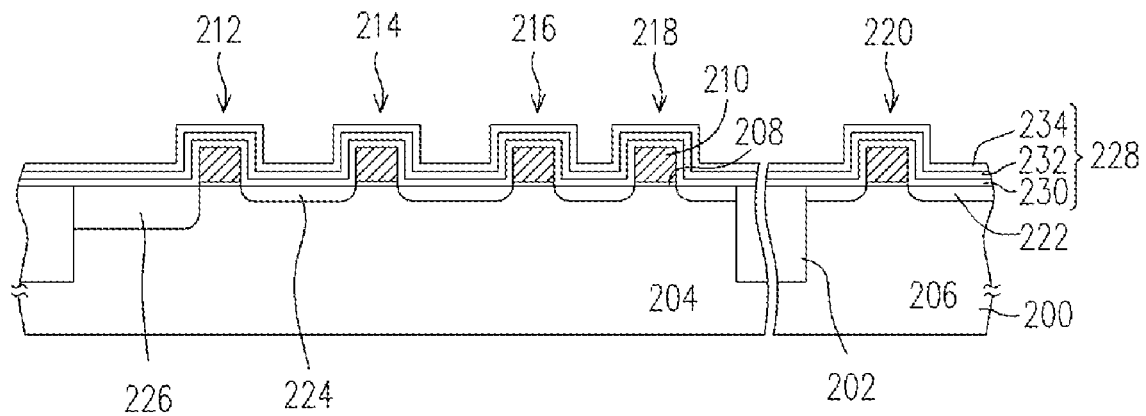
FIGS. 3A through 3D are cross-sectional flow charts schematically illustrating a process of fabricating of an MOS device according to another embodiment of the present invention.

Referring to FIG. 3A, a substrate 200 is provided. The substrate 200 is, for example, a semiconductor substrate such as a silicon substrate. First, an isolation structure 202 is formed in the substrate 200 to define active regions 204 and 206. The active region 204 is a CMOS image sensor region, and the active region 206 is a non-CMOS image sensor region. The isolation structure 202 is formed by performing a shallow trench isolation method or a localized oxidation isolation method. Then, a P-type filed region (not shown) is formed at the periphery and on the bottom of the isolation structure 202.

Next, a transfer resistor 212, a reset transistor 214, a source follower transistor 216, a select transistor 218, a floating node doped region 224, and a photodiode doped region 226 are formed in the CMOS image sensor region 204 of the substrate 200. In addition, a transistor 220 is formed in the non-CMOS image sensor region 206. The transfer resistor 212, the reset transistor 214, the source follower transistor 216, the select transistor 218 and the transistor 220 all include gate dielectric layers 208, gates 210, and source/drain extension regions 222. The material of the gate dielectric layers 208 is, for example, silicon oxide, and the method of forming the gate dielectric layers 208 includes performing a thermal oxidation process, for example. The material of the gates 210 is polysilicon, for example, and the method of forming the gates 210 includes performing a CVD process, for example. The source/drain extension regions 222 may be constructed by performing ion implantation processes.

Thereafter, a spacer stacked layer 228 is formed on the substrate 200. The spacer stacked layer 228 includes a bottom layer 230, an inter-layer 232 and a top layer 234. The etching rate of the inter-layer 232 is different from that of the bottom layer 230 and the top layer 234. In one embodiment, the materials of the bottom layer 230/the inter-layer 232/the top layer 234 include silicon oxide/silicon nitride/silicon oxide, for example, and the thicknesses thereof are 300-500 angstroms/100-300 angstroms/300-700 angstroms. The method of forming the bottom layer 230/the inter-layer 232/the top layer 234 includes performing the CVD process, for example.

Figure 3B:
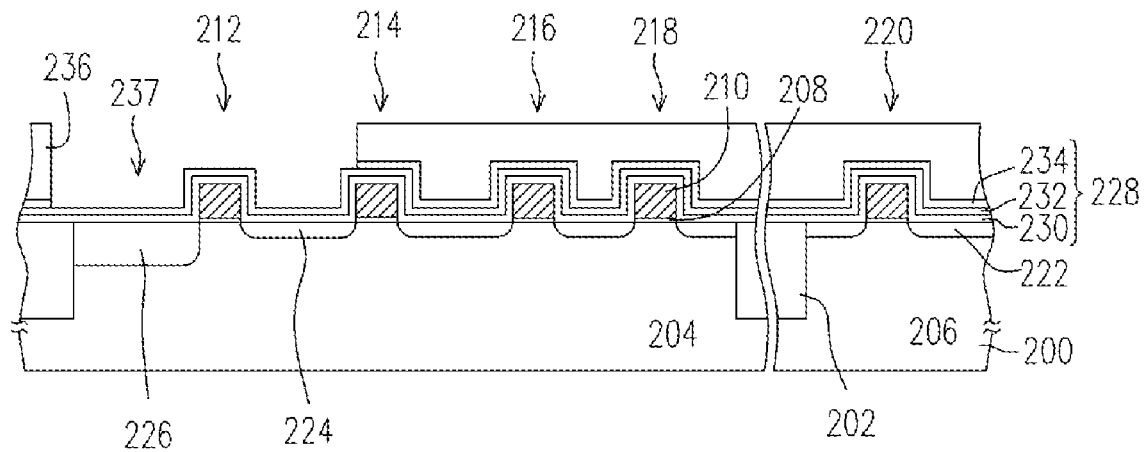

After that, referring to FIG. 3B, a mask layer 236 is formed on the top layer 234. The mask layer 236 has an opening 237 which exposes the photodiode doped region 226 and is extended to the transfer transistor 212 adjacent to the photodiode doped region 226, the floating node doped region 224, and a part of the gate 208 of the reset transistor 214. The mask layer 236 is, for example, a patterned photoresist layer, and the method of forming the mask layer 236 includes coating photoresist, performing an exposure process, and implementing a development process.

After that, the top layer 234 exposed by the opening 237 is removed with use of the mask layer 236 as a hard mask, such that the inter-layer 232 below the top layer 234 is exposed. The method of removing the top layer 234 may be a dry etching method or a wet etching method. In one embodiment, the materials of the bottom layer 230/the inter-layer 232/the top layer 234 include silicon oxide/silicon nitride/silicon oxide. The remained inter-layer 232 may be employed as an anti-reflective layer. And the stress arisen from the remained inter-layer 232 may be cushioned through the bottom layer 230 in the thickness of 300-500 angstroms.

Figure 3C:
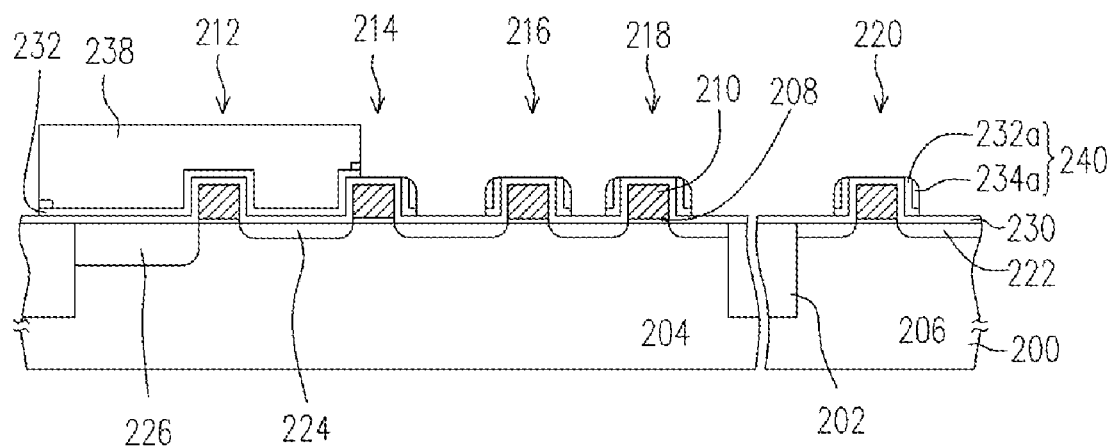

Afterwards, referring to FIG. 3C, the mask layer 236 is removed. Another mask layer 238 is then formed on a region correspondingly exposed by the opening 237, such that the photodiode doped region 226, the transfer transistor 212, the floating node doped region 224 and a part of the gate 208 of the reset transistor 214 are covered while other regions are exposed. The mask layer 238 is, for example, a patterned photoresist layer, and the method of forming the mask layer 238 includes coating photoresist, performing the exposure process, and implementing the development process.

Next, an anisotropic etching operation is performed with use of the mask layer 238 as the mask to remove a portion of the top layer 234 and the inter-layer 232 exposed by the mask layer 238, such that spacers 240 are formed at a sidewall of the reset transistor 214 and at both sidewalls of the source follower transistor 216, the select transistor 218, and the transistor 220. Each of the spacers 240 is constructed by an inner spacer 232a formed by the inter-layer 232 and an outer spacer 234a formed by the top layer 234. The anisotropic etching operation is a plasma etching process, for example. During the etching process, the photodiode doped region 226 is covered by the mask layer 238, and thus the photodiode doped region 226 is not damaged.

Figure 3D:
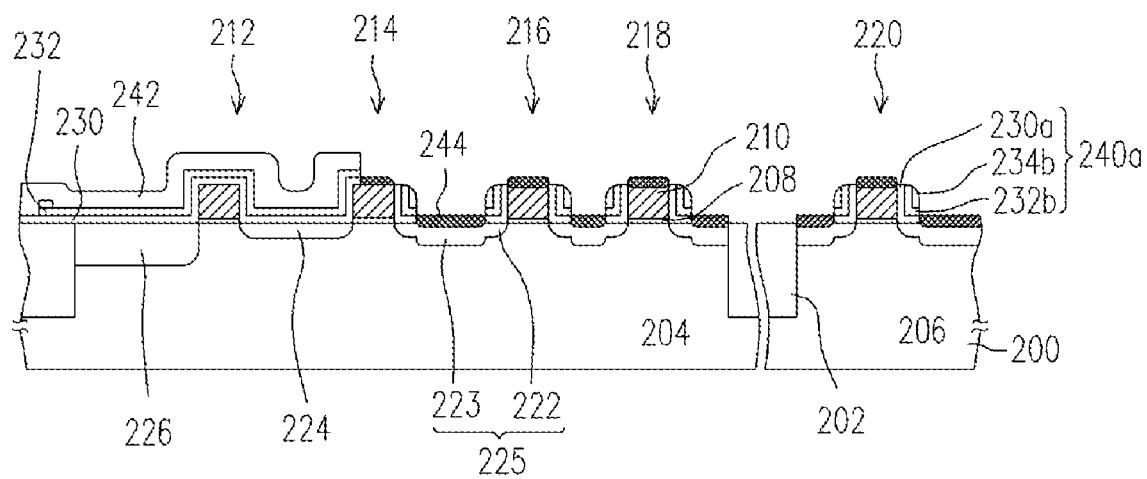

Thereafter, as shown in FIG. 3D, the mask layer 238 is removed. After that, the ion implantation process may be performed to form source/drain contact regions 223 in the substrate 200. The source/drain contact regions 223 and the source/drain extension regions 222 together form source/drain regions 225. Afterwards, an SAB layer 242 is formed on the substrate 200, and the bottom layer 230 exposed by the SAB layer 242 is etched and removed, such that predetermined regions in which a metal silicide layer to be formed are exposed. The material of the SAB layer 242 is, for example, silicon nitride, SiON, or silicon oxide, and the method of forming the SAB layer 242 includes performing the CVD process or an HTO process, for example. In one embodiment, the SAB layer 242 covers the photodiode doped region 226, the transfer transistor 212, the floating node doped region 224, and a part of the gate 210 of the reset transistor 214. During the etching process, the inter-layer 232 and the bottom layer 230 respectively disposed on the transfer transistor 212 and on the reset transistor 214 both covered by the SAB layer 242 are left. And the spacers 240 of the reset transistor 214, of the source follower transistor 216, of the select transistor 218 and of the transistor 220 all exposed by the SAB layer 242 are partially etched to form spacers 240a composed of inner spacers 232b and outer spacers 234b. A liner layer 230a sandwiched between one of the spacers 240a and the gates 210 is left after the bottom layer 230 is etched. Next, a salicide process is performed to form a metal silicide layer 244 on the gates 210 and on the source/drain regions 225 both exposed by the SAB layer 242. The metal silicide layer 244 is formed by, for example, forming a metal layer on the substrate 200 at first. The metal used for fabricating the metal layer may be a refractory metal selected from one of the groups consisting of nickel, cobalt, titanium, copper, molybdenum, tantalum, tungsten, erbium, zirconium, platinum and an alloy including one or more of said metals. Afterwards, an annealing process is performed to enable the silicon in the substrate 200 or in the gates 210 to react with the metal layer and to form a metal silicide having a lower resistance. Thereafter, the unreacted metal layer is removed.

Thereafter, the successive processes are performed. Since the subsequent processes are well-known to people skilled in the art, detailed descriptions are omitted herein.

In the above fabrication process, a passivation layer (not shown) may be alternatively formed on a surface of the photodiode doped region 226 so as to prevent current leakage. The passivation layer is, for example, a P-doped region.

Third Embodiment

FIGS. 4A through 4D are cross-sectional flow charts schematically illustrating a process of fabricating of another MOS device according to an embodiment of the present invention.

Figure 4A:
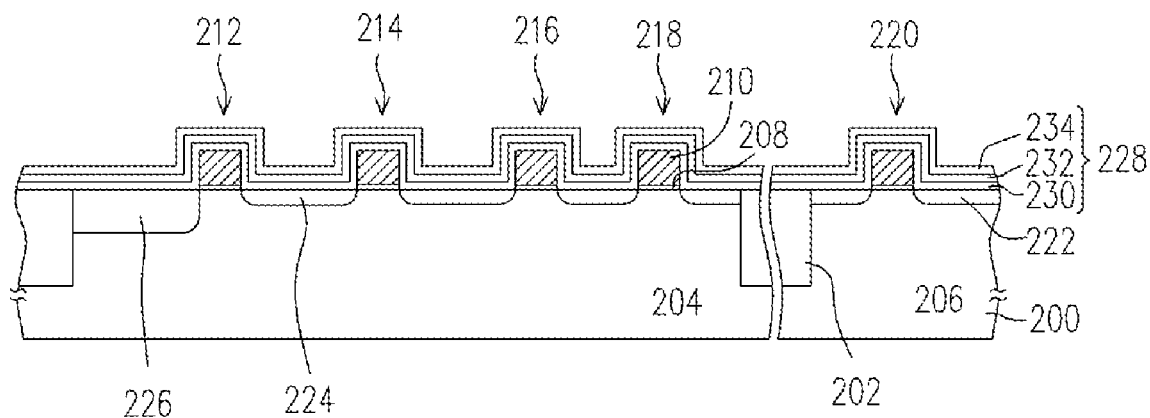
FIGS. 4A through 4D are cross-sectional flow charts schematically illustrating a process of fabricating of an MOS device according to still another embodiment of the present invention.

Referring to FIG. 4A, a substrate 200 is provided. The substrate 200 is, for example, a semiconductor substrate such as a silicon substrate. First, an isolation structure 202 is formed in the substrate 200 to define active regions 204 and 206. The active region 204 is a CMOS image sensor region, and the active region 206 is a non-CMOS image sensor region. The isolation structure 202 is formed by performing a shallow trench isolation method or a localized oxidation isolation method. Then, a P-type field region (not shown) is formed at the periphery and on the bottom of the isolation structure 202.

Next, a transfer resistor 212, a reset transistor 214, a source follower transistor 216, a select transistor 218, a floating node doped region 224, and a photodiode doped region 226 are formed in the CMOS image sensor region 204 of the substrate 200. In addition, a transistor 220 is formed in the non-CMOS image sensor region 206. The transfer resistor 212, the reset transistor 214, the source follower transistor 216, the select transistor 218 and the transistor 220 all include gate dielectric layers 208, gates 210, and source/drain extension regions 222. The material of the gate dielectric layers 208 is, for example, silicon oxide, and the method of forming the gate dielectric layers 208 includes performing a thermal oxidation process, for example. The material of the gates 210 is polysilicon, for example, and the method of forming the gates 210 includes performing a CVD process, for example. The source/drain extension regions 222 may be constructed by performing ion implantation processes.

Thereafter, a spacer stacked layer 228 is formed on the substrate 200. The spacer stacked layer 228 includes a bottom layer 230, an inter-layer 232 and a top layer 234. The etching rate of the inter-layer 232 is different from that of the bottom layer 230 and the top layer 234. In one embodiment, the materials of the bottom layer 230/the inter-layer 232/the top layer 234 include silicon oxide/silicon nitride/silicon oxide, for example, and the thicknesses thereof are 300-500 angstroms/100-300 angstroms/300-700 angstroms. The method of forming the bottom layer 230/the inter-layer 232/the top layer 234 includes performing the CVD process, for example.

Figure 4B:
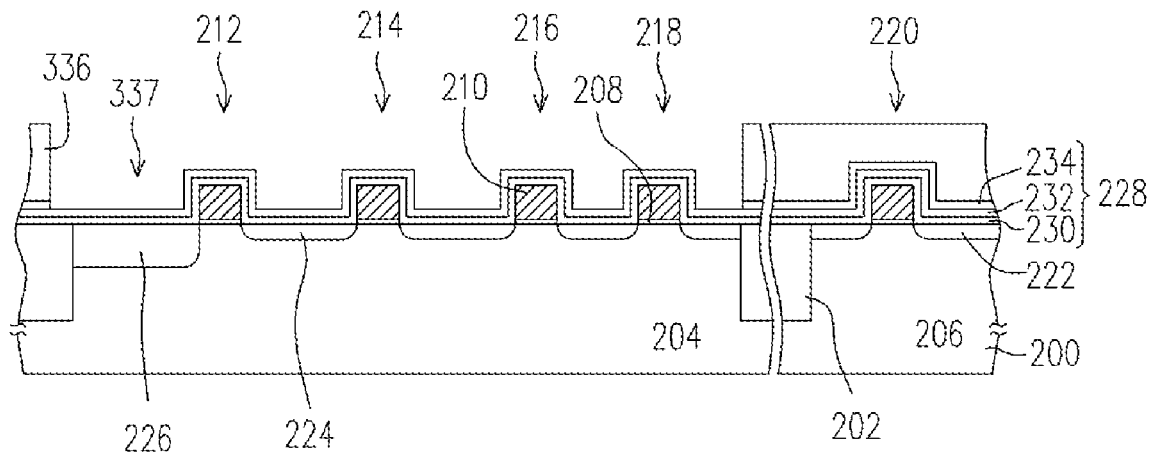

After that, referring to FIG. 4B, a mask layer 336 is formed on the top layer 234. The mask layer 336 has an opening 337 exposing the whole CMOS image sensor region 204. The mask layer 336 is, for example, a patterned photoresist layer, and the method of forming the mask layer 336 includes coating photoresist, performing an exposure process, and implementing a development process.

After that, the top layer 234 exposed by the opening 337 is removed with use of the mask layer 336 as a hard mask, such that the inter-layer 232 below the top layer 234 is exposed. The method of removing the top layer 234 may be a dry etching method or a wet etching method. In one embodiment, the materials of the bottom layer 230/the inter-layer 232/the top layer 234 include silicon oxide/silicon nitride/silicon oxide. The remained inter-layer 232 may be employed as an anti-reflective layer. And the stress arisen from the remained inter-layer 232 may be cushioned through the bottom layer 230 in the thickness of 300-500 angstroms.

Figure 4C:
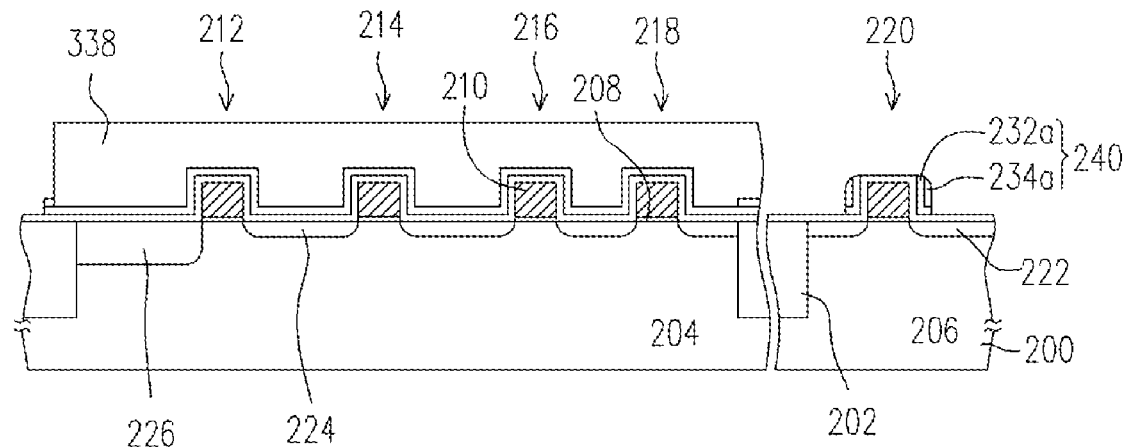

Afterwards, referring to FIG. 4C, the mask layer 336 is removed. Another mask layer 338 is then formed on a region correspondingly exposed by the opening 337, such that the whole CMOS image sensor region 204 is covered while other regions are exposed. The mask layer 338 is, for example, a patterned photoresist layer, and the method of forming the mask layer 338 includes coating photoresist, performing the exposure process, and implementing the development process.

Next, an anisotropic etching operation is performed with use of the mask layer 338 as the mask to remove a portion of the top layer 234 and the inter-layer 232 exposed by the mask layer 338, such that spacer 240 is formed at a sidewall of the transistor 220. The spacers 240 is constructed by an inner spacer 232a formed by the inter-layer 232 and an outer spacer 234a formed by the top layer 234. The anisotropic etching operation is a plasma etching process, for example. During the etching process, the photodiode doped region 226 is covered by the mask layer 338, and thus the photodiode doped region 226 is not damaged through etching.

Figure 4D:
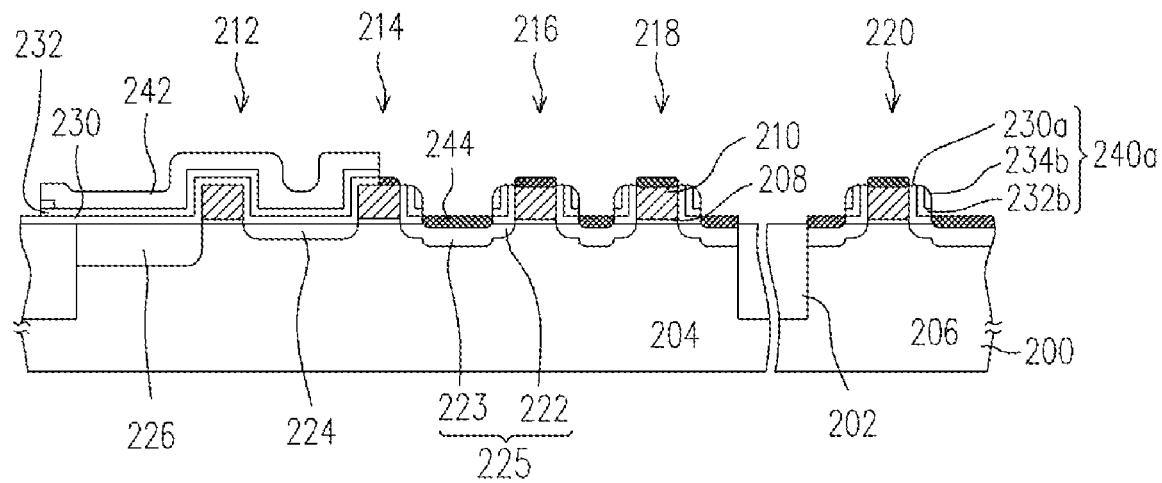

Thereafter, as shown in FIG. 4D, the mask layer 338 is removed. After that, the ion implantation process may be performed to form source/drain contact regions 223 in the substrate 200. The source/drain contact regions 223 and the source/drain extension regions 222 together form source/drain regions 225. Afterwards, an SAB layer 242 is formed on the substrate 200, and the bottom layer 230 exposed by the SAB layer 242 is etched and removed, such that predetermined regions in which a metal silicide layer to be formed are exposed. The material of the SAB layer 242 is, for example, silicon nitride, SiON, or silicon oxide, and the method of forming the SAB layer 242 includes performing the CVD process or an HTO process, for example. In one embodiment, the SAB layer 242 covers the photodiode doped region 226, the transfer transistor 212, the floating node doped region 224, and a part of the gate 210 of the reset transistor 214. During the etching process, the inter-layer 232 and the bottom layer 230 respectively disposed on the transfer transistor 212 and on the reset transistor 214 both covered by the SAB layer 242 are left. The inter-layer 232 and the bottom layer 230 on the reset transistor 214, the source follower transistor 216, and the select transistor 218 exposed by the SAB layer 242 together construct spacers 240a and liner layers 230a. And the spacers 240 of the transistor 220 are partially etched to form spacers 240a composed of inner spacers 232b and outer spacers 234b. The liner layer 230a sandwiched between one of the spacers 240a and the gates 210 are left after the bottom layer 230 is etched. Next, a salicide process is performed to form a metal silicide layer 244 on the gates 210 and on the source/drain regions 225 both exposed by the SAB layer 242. The metal silicide layer 244 is formed by, for example, forming a metal layer on the substrate 200 at first. The metal used for fabricating the metal layer may be a refractory metal selected from one of the groups consisting of nickel, cobalt, titanium, copper, molybdenum, tantalum, tungsten, erbium, zirconium, platinum and an alloy including one or more of said metals. Afterwards, an annealing process is performed to enable the silicon in the substrate 200 or in the gates 210 to react with the metal layer and to form a metal silicide having a lower resistance. Thereafter, the unreacted metal layer is removed.

Thereafter, the successive processes are performed. Since the subsequent processes are well-known to people skilled in the art, detailed descriptions are omitted herein.

In the above fabrication process, a passivation layer (not shown) may be alternatively formed on a surface of the photodiode doped region 226 so as to prevent current leakage. The passivation layer is, for example, a P-doped region.

In the above three embodiments, as shown in FIGS. 2B, 3B and 4B, the top layer 234 exposed by the openings 137, 237 and 337 of the mask layers 136, 236 and 336 is removed, and the bottom layer 230 and the inter-layer 232 are left on the photodiode doped region 226, which enables the inter-layer 232 to be an anti-reflective layer and allows the bottom layer 230 to be a buffer layer. Alternatively, the bottom layer 230 can be the only layer left on the photodiode doped region 226. The required anti-reflective layer on the photodiode doped region 226 can be formed later in the subsequent processes. It is not necessary for the bottom layer 230 to cushion the stress arisen from the remained inter-layer 232, for the inter-layer 232 on the photodiode doped region 226 is removed. Hence, the bottom layer 230 in the present embodiment can be in a thinner thickness than the bottom layer 230 provided in the above-mentioned three embodiments. Detailed descriptions will be given hereinafter with reference to FIGS. 5A through 5D, FIGS. 6A through 6D, and FIGS. 7A through 7D.

Fourth Embodiment

FIGS. 5A through 5D are cross-sectional flow charts schematically illustrating a process of fabricating of an MOS device according to an embodiment of the present invention.

Figure 5A:
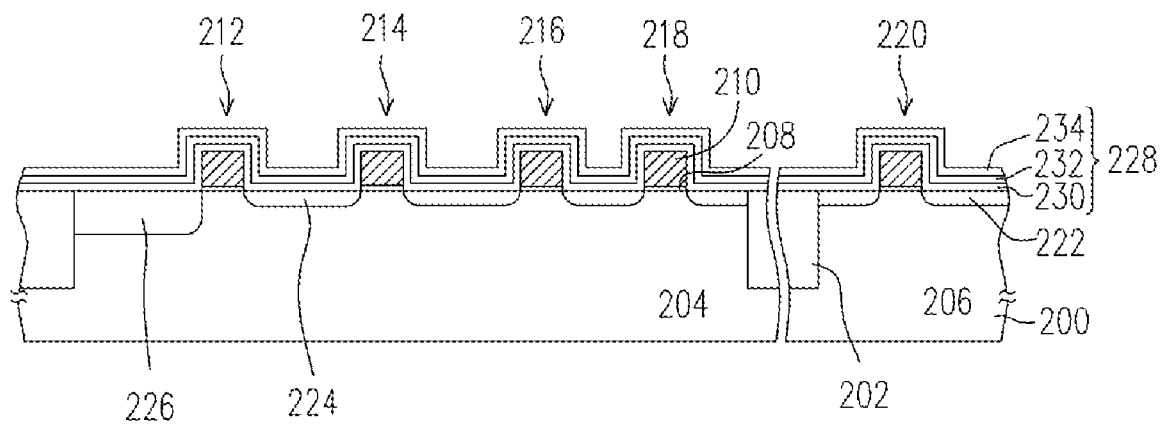
FIGS. 5A through 5D are cross-sectional flow charts schematically illustrating a process of fabricating of an MOS device according to yet still another embodiment of the present invention.

Referring to FIG. 5A, a substrate 200 is provided. The substrate 200 is, for example, a semiconductor substrate such as a silicon substrate. First, an isolation structure 202 is formed in the substrate 200 to define active regions 204 and 206. The active region 204 is a CMOS image sensor region, and the active region 206 is a non-CMOS image sensor region. The isolation structure 202 is formed by performing a shallow trench isolation method or a localized oxidation isolation method. Then, a P-type field region (not shown) is formed at the periphery and on the bottom of the isolation structure 202.

Next, a transfer resistor 212, a reset transistor 214, a source follower transistor 216, a select transistor 218, a floating node doped region 224, and a photodiode doped region 226 are formed in the CMOS image sensor region 204 of the substrate 200. In addition, a transistor 220 is formed in the non-CMOS image sensor region 206. The transfer resistor 212, the reset transistor 214, the source follower transistor 216, the select transistor 218 and the transistor 220 all include gate dielectric layers 208, gates 210, and source/drain extension regions 222. The material of the gate dielectric layers 208 is, for example, silicon oxide, and the method of forming the gate dielectric layers 208 includes performing a thermal oxidation process, for example. The material of the gates 210 is polysilicon, for example, and the method of forming the gates 210 includes performing a CVD process, for example. The source/drain extension regions 222 may be constructed by performing ion implantation processes.

Thereafter, a spacer stacked layer 228 is formed on the substrate 200. The spacer stacked layer 228 includes a bottom layer 230, an inter-layer 232 and a top layer 234. The etching rate of the inter-layer 232 is different from that of the bottom layer 230 and the top layer 234. In one embodiment, the materials of the bottom layer 230/the inter-layer 232/the top layer 234 include silicon oxide/silicon nitride/silicon oxide, for example, and the thicknesses thereof are 100-300 angstroms/100-300 angstroms/300-700 angstroms. The method of forming the bottom layer 230/the inter-layer 232/the top layer 234 includes performing the CVD process, for example.

Figure 5B:
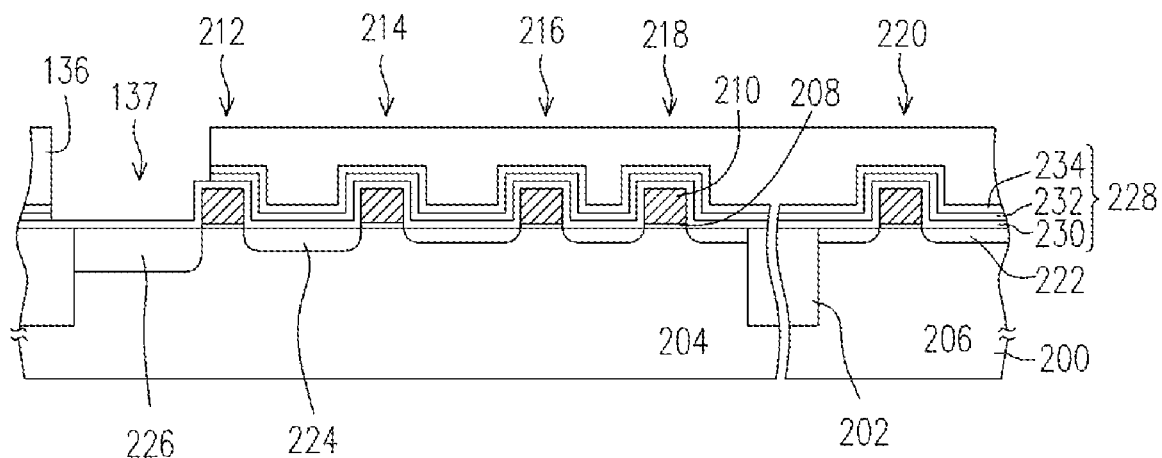

Thereafter, referring to FIG. 5B, a mask layer 136 is formed on the top layer 234. The mask layer 136 has an opening 137 which exposes the photodiode doped region 226 and is extended to a part of the gate 208 of the transfer transistor 212 adjacent to the photodiode doped region 226. The mask layer 136 is, for example, a patterned photoresist layer, and the method of forming the mask layer 136 includes coating photoresist, performing an exposure process, and implementing a development process.

After that, the top layer 234 and the inter-layer 232 both exposed by the opening 137 are removed with use of the mask layer 136 as a hard mask, such that the bottom layer 230 below the inter-layer 232 is exposed. The method of removing the top layer 234 and the inter-layer 232 may be a dry etching method or a wet etching method.

Figure 5C:
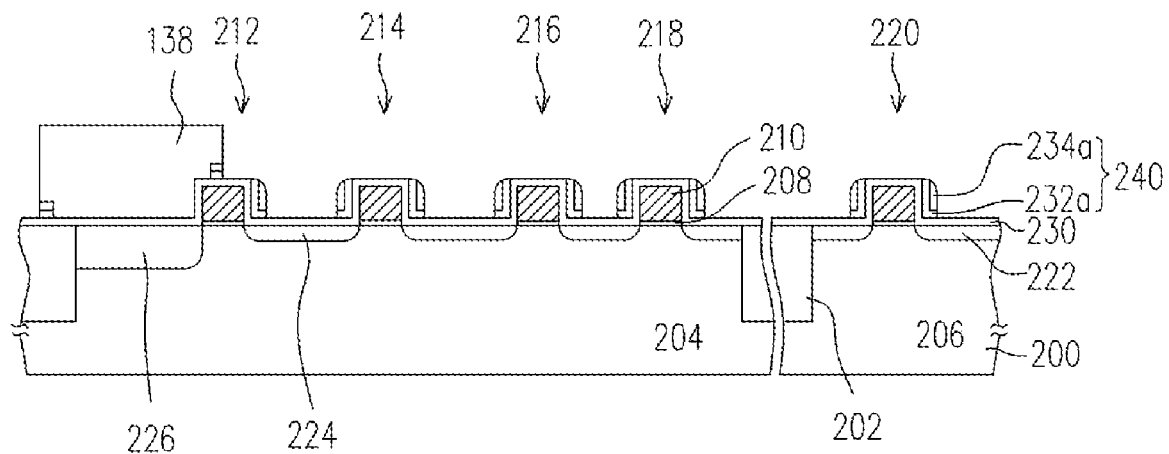

Afterwards, referring to FIG. 5C, the mask layer 136 is removed. Another mask layer 138 is then formed on a region correspondingly exposed by the opening 137, such that the photodiode doped region 226 and a part of the gate 208 of the transfer transistor 212 are covered while other regions are exposed. The mask layer 138 is, for example, a patterned photoresist layer, and the method of forming the mask layer 138 includes coating photoresist, performing the exposure process, and implementing the development process.

Next, an anisotropic etching operation is performed with use of the mask layer 138 as the mask to remove a portion of the top layer 234 and the inter-layer 232 exposed by the mask layer 138, such that spacers 240 are formed at a sidewall of the transfer transistor 212 and at both sidewalls of the reset transistor 214, the source follower transistor 216, the select transistor 218, and the transistor 220. One of the spacers 240 is constructed by an inner spacer 232a formed by the inter-layer 232 and an outer spacer 234a formed by the top layer 234. The anisotropic etching operation is a plasma etching process, for example. During the etching process, the photodiode doped region 226 is covered by the mask layer 138, and thus the photodiode doped region 226 is not damaged.

Figure 5D:
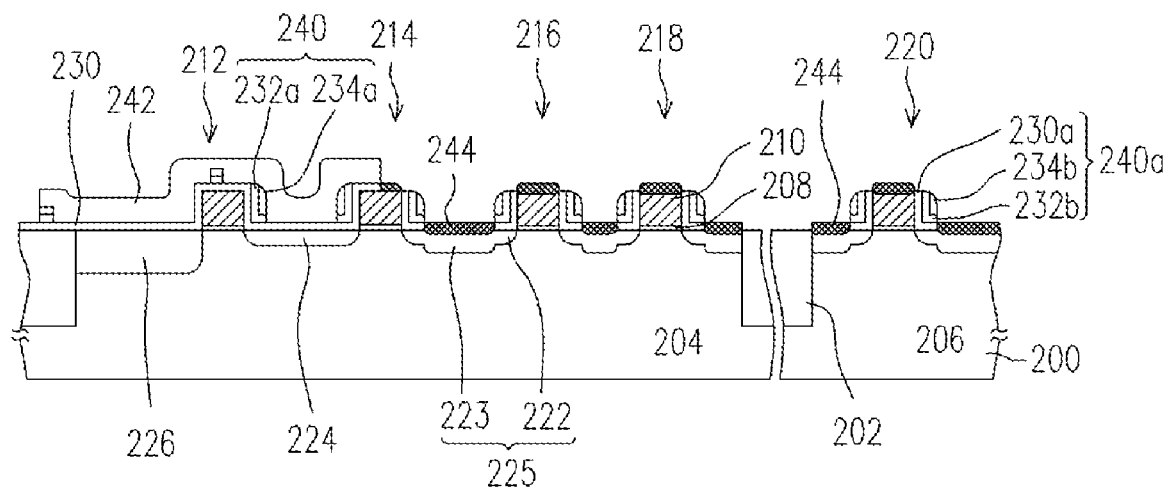

Thereafter, as shown in FIG. 5D, the mask layer 138 is removed. After that, the ion implantation process may be performed to form source/drain contact regions 223 in the substrate 200. The source/drain contact regions 223 and the source/drain extension regions 222 together form source/drain regions 225. Afterwards, an SAB layer 242 is formed on the substrate 200, and an inter-layer 232a and the bottom layer 230 both exposed by the SAB layer 242 are etched and removed through the anisotropic etching operation, such that predetermined regions in which a metal silicide layer to be formed are exposed. The material of the SAB layer 242 is, for example, silicon nitride, SiON, or silicon oxide, and the method of forming the SAB layer 242 includes performing the CVD process or an HTO process, for example. In one embodiment, the SAB layer 242 covers the photodiode doped region 226, the transfer transistor 212, the floating node doped region 224 and a part of the gate 210 of the reset transistor 214. During the etching process, the spacers 240 of the transfer transistor 212 and of the reset transistor 214 both covered by the SAB layer 242 are left. And the spacers 240 of the reset transistor 214, of the source follower transistor 216, of the select transistor 218 and of the transistor 220 all exposed by the SAB layer 242 are partially etched to form spacers 240a composed of inner spacers 232b and outer spacers 234b. A liner layer 230a sandwiched between one of the spacers 240a and the gates 210 is left after the bottom layer 230 is etched. Next, a salicide process is performed to form a metal silicide layer 244 on the gates 210 and on the source/drain regions 225 both exposed by the SAB layer 242. The metal silicide layer 244 is formed by, for example, forming a metal layer on the substrate 200 at first. The metal used for fabricating the metal layer may be a refractory metal selected from one of the groups consisting of nickel, cobalt, titanium, copper, molybdenum, tantalum, tungsten, erbium, zirconium, platinum and an alloy including one or more of said metals. Afterwards, an annealing process is performed to enable the silicon in the substrate 200 or in the gates 210 to react with the metal layer and to form a metal silicide having a lower resistance. Thereafter, the unreacted metal layer is removed.

Thereafter, the successive processes are performed. Since the subsequent processes are well-known to people skilled in the art, detailed descriptions are omitted herein.

In the above fabrication process, a passivation layer (not shown) may be alternatively formed on a surface of the photodiode doped region 226 so as to prevent current leakage. The passivation layer is, for example, a P-doped region.

Fifth Embodiment

FIGS. 6A through 6D are cross-sectional flow charts schematically illustrating a process of fabricating of another MOS device according to an embodiment of the present invention.

Figure 6A:
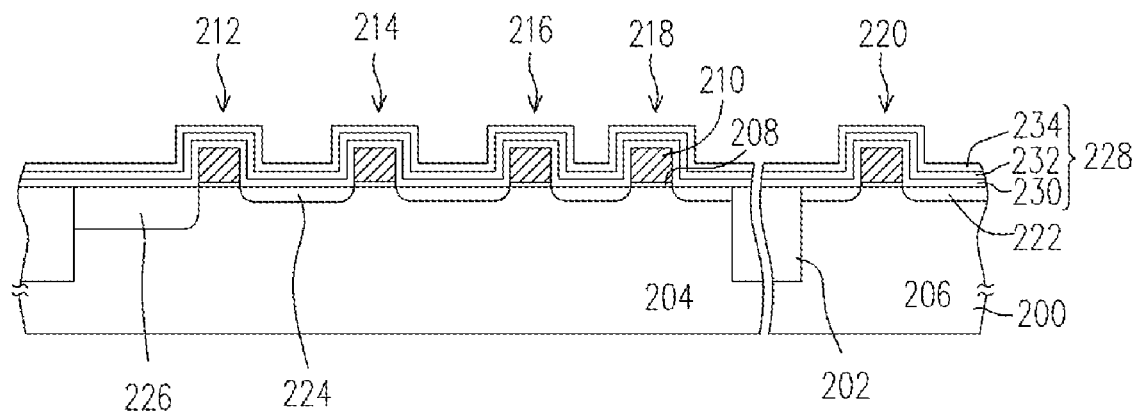
FIGS. 6A through 6D are cross-sectional flow charts schematically illustrating a process of fabricating of an MOS device according to yet still another embodiment of the present invention.

Referring to FIG. 6A, a substrate 200 is provided. The substrate 200 is, for example, a semiconductor substrate such as a silicon substrate. First, an isolation structure 202 is formed in the substrate 200 to define active regions 204 and 206. The active region 204 is a CMOS image sensor region, and the active region 206 is a non-CMOS image sensor region. The isolation structure 202 is formed by performing a shallow trench isolation method or a localized oxidation isolation method. Then, a P-type field region (not shown) is formed at the periphery and on the bottom of the isolation structure 202.

Next, a transfer resistor 212, a reset transistor 214, a source follower transistor 216, a select transistor 218, a floating node doped region 224, and a photodiode doped region 226 are formed in the CMOS image sensor region 204 of the substrate 200. In addition, a transistor 220 is formed in the non-CMOS image sensor region 206. The transfer resistor 212, the reset transistor 214, the source follower transistor 216, the select transistor 218 and the transistor 220 all include gate dielectric layers 208, gates 210, and source/drain extension regions 222. The material of the gate dielectric layers 208 is, for example, silicon oxide, and the method of forming the gate dielectric layers 208 includes performing a thermal oxidation process, for example. The material of the gates 210 is polysilicon, for example, and the method of forming the gates 210 includes performing a CVD process, for example. The source/drain extension regions 222 may be constructed by performing ion implantation processes.

Thereafter, a spacer stacked layer 228 is formed on the substrate 200. The spacer stacked layer 228 includes a bottom layer 230, an inter-layer 232 and a top layer 234. The etching rate of the inter-layer 232 is different from that of the bottom layer 230 and the top layer 234. In one embodiment, the materials of the bottom layer 230/the inter-layer 232/the top layer 234 include silicon oxide/silicon nitride/silicon oxide, for example, and the thicknesses thereof are 100-300 angstroms/100-300 angstroms/300-700 angstroms. The method of forming the bottom layer 230/the inter-layer 232/the top layer 234 includes performing the CVD process, for example.

Figure 6B:
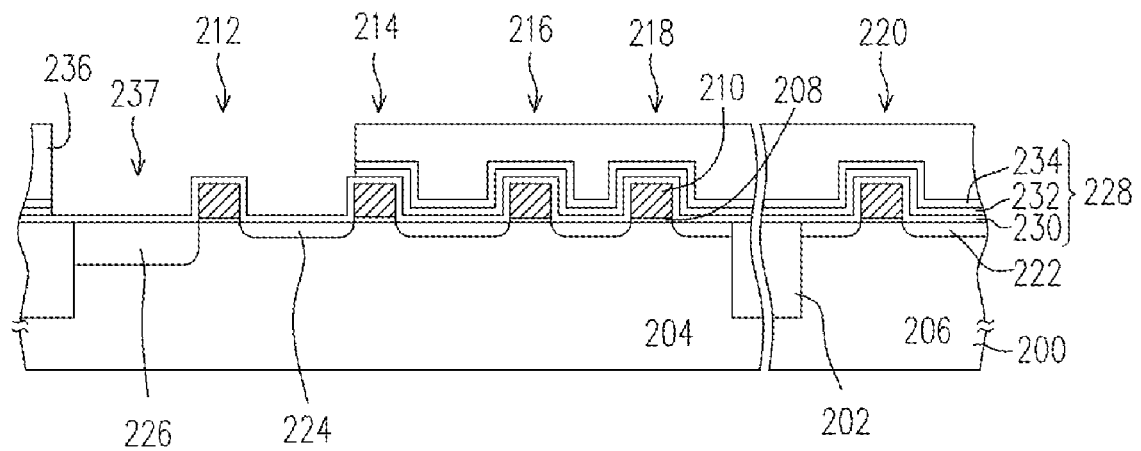

After that, referring to FIG. 6B, a mask layer 236 is formed on the top layer 234. The mask layer 236 has an opening 237 which exposes the photodiode doped region 226 and is extended to the transfer transistor 212 adjacent to the photodiode doped region 226, the floating node doped region 224, and a part of the gate 208 of the reset transistor 214. The mask layer 236 is, for example, a patterned photoresist layer, and the method of forming the mask layer 236 includes coating photoresist, performing an exposure process, and implementing a development process.

After that, the top layer 234 and the inter-layer 232 both exposed by the opening 237 are removed with use of the mask layer 236 as a hard mask, such that the bottom layer 230 below the inter-layer 232 is exposed. The method of removing the top layer 234 and the inter-layer 232 may be a dry etching method or a wet etching method.

Figure 6C:
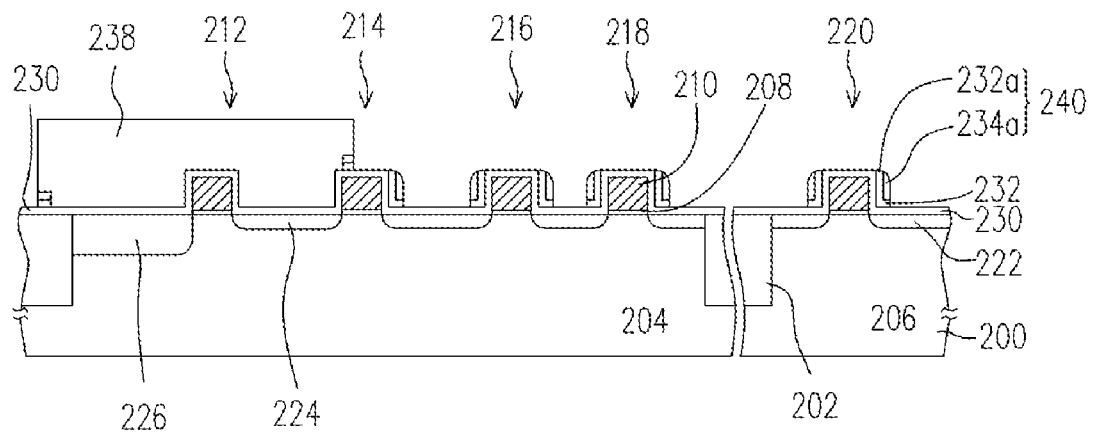

Afterwards, referring to FIG. 6C, the mask layer 236 is removed. Another mask layer 238 is then formed on a region correspondingly exposed by the opening 237, such that the photodiode doped region 226, the transfer transistor 212, the floating node doped region 224 and a part of the gate 208 of the reset transistor 214 are covered while other regions are exposed. The mask layer 238 is, for example, a patterned photoresist layer, and the method of forming the mask layer 238 includes coating photoresist, performing the exposure process, and implementing the development process.

Next, an anisotropic etching operation is performed with use of the mask layer 238 as the mask to remove a portion of the top layer 234 and the inter-layer 232 exposed by the mask layer 238, such that spacers 240 are formed at a sidewall of the reset transistor 214 and at both sidewalls of the source follower transistor 216, the select transistor 218, and the transistor 220. Each of the spacers 240 is constructed by an inner spacer 232a formed by the inter-layer 232 and an outer spacer 234a formed by the top layer 234. The anisotropic etching operation is a plasma etching process, for example. During the etching process, the photodiode doped region 226 is covered by the mask layer 238, and thus, the photodiode doped region 226 is not damaged through etching.

Figure 6D:
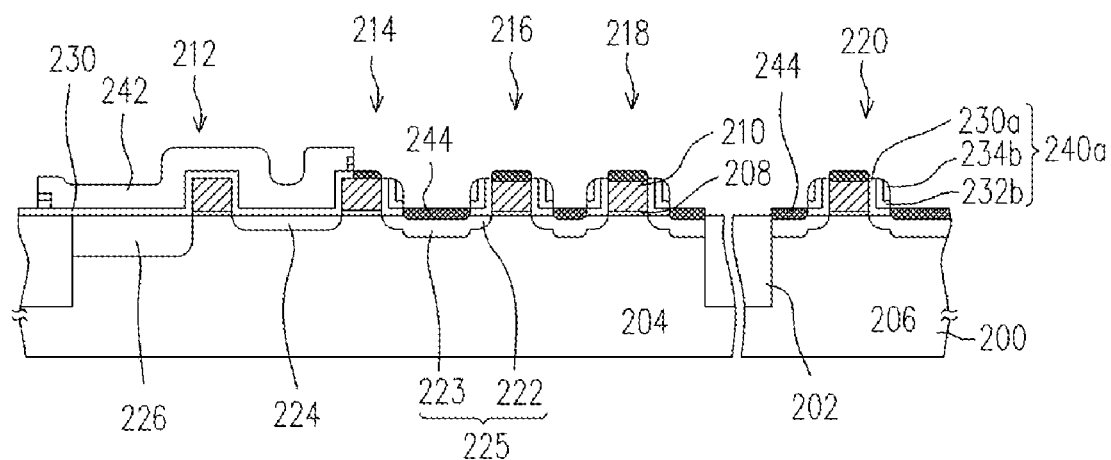

Thereafter, as shown in FIG. 6D, the mask layer 238 is removed. After that, the ion implantation process may be performed to form source/drain contact regions 223 in the substrate 200. The source/drain contact regions 223 and the source/drain extension regions 222 together form source/drain regions 225. Afterwards, an SAB layer 242 is formed on the substrate 200, and an inter-layer 232a and the bottom layer 230 both exposed by the SAB layer 242 are etched and removed through the anisotropic etching operation, such that predetermined regions in which a metal silicide layer to be formed are exposed. The material of the SAB layer 242 is, for example, silicon nitride, SiON, or silicon oxide, and the method of forming the SAB layer 242 includes performing the CVD process or an HTO process, for example. In one embodiment, the SAB layer 242 covers the photodiode doped region 226, the transfer transistor 212, the floating node doped region 224, and a part of the gate 210 of the reset transistor 214. During the etching process, the bottom layer 230 covered by the SAB layer 242 is left. And the spacers 240 of the reset transistor 214, of the source follower transistor 216, of the select transistor 218 and of the transistor 220 all exposed by the SAB layer 242 are partially etched to form spacers 240a composed of inner spacers 232b and outer spacers 234b. A liner layer 230a sandwiched between one of the spacers 240a and the gates 210 is left after the bottom layer 230 is etched. Next, a salicide process is performed to form a metal silicide layer 244 on the gates 210 and on the source/drain regions 225 both exposed by the SAB layer 242. The metal silicide layer 244 is formed by, for example, forming a metal layer on the substrate 200 at first. The metal used for fabricating the metal layer may be a refractory metal selected from one of the groups consisting of nickel, cobalt, titanium, copper, molybdenum, tantalum, tungsten, erbium, zirconium, platinum and an alloy including one or more of said metals. Afterwards, an annealing process is performed to enable the silicon in the substrate 200 or in the gates 210 to react with the metal layer and to form a metal silicide having a lower resistance. Thereafter, the unreacted metal layer is removed.

Thereafter, the successive processes are performed. Since the subsequent processes are well-known to people skilled in the art, detailed descriptions are omitted herein.

In the above fabrication process, a passivation layer (not shown) may be alternatively formed on a surface of the photodiode doped region 226 so as to prevent current leakage. The passivation layer is, for example, a P-doped region.

Sixth Embodiment

FIGS. 7A through 7D are cross-sectional flow charts schematically illustrating a process of fabricating of another MOS device according to an embodiment of the present invention.

Figure 7A:
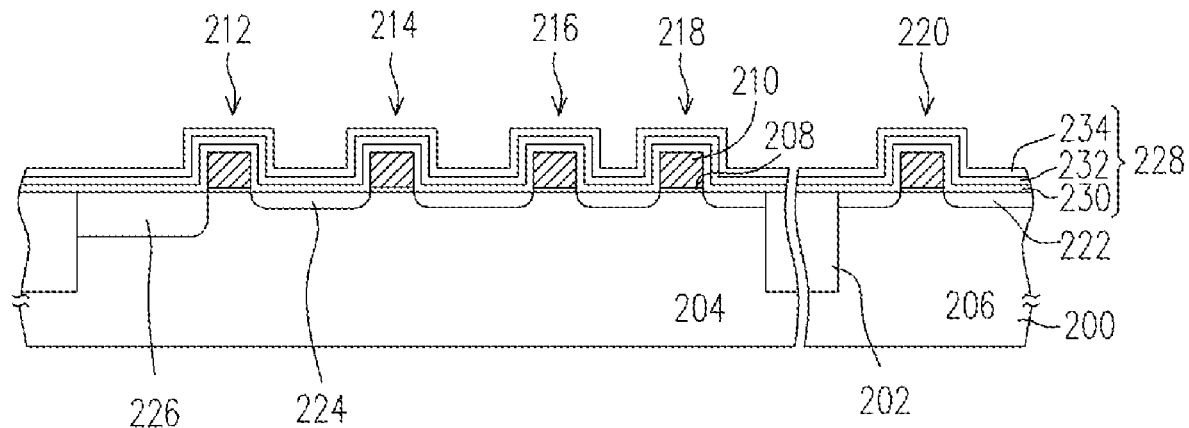
FIGS. 7A through 7D are cross-sectional flow charts schematically illustrating a process of fabricating of an MOS device according to another embodiment of the present invention.

Referring to FIG. 7A, a substrate 200 is provided. The substrate 200 is, for example, a semiconductor substrate such as a silicon substrate. First, an isolation structure 202 is formed in the substrate 200 to define active regions 204 and 206. The active region 204 is a CMOS image sensor region, and the active region 206 is a non-CMOS image sensor region. The isolation structure 202 is formed by performing a shallow trench isolation method or a localized oxidation isolation method. Then, a P-type field region (not shown) is formed at the periphery and on the bottom of the isolation structure 202.

Next, a transfer resistor 212, a reset transistor 214, a source follower transistor 216, a select transistor 218, a floating node doped region 224, and a photodiode doped region 226 are formed in the CMOS image sensor region 204 of the substrate 200. In addition, a transistor 220 is formed in the non-CMOS image sensor region 206. The transfer resistor 212, the reset transistor 214, the source follower transistor 216, the select transistor 218 and the transistor 220 all include gate dielectric layers 208, gates 210, and source/drain extension regions 222. The material of the gate dielectric layers 208 is, for example, silicon oxide, and the method of forming the gate dielectric layers 208 includes performing a thermal oxidation process, for example. The material of the gates 210 is polysilicon, for example, and the method of forming the gates 210 includes performing a CVD process, for example. The source/drain extension regions 222 may be constructed by performing ion implantation processes.

Thereafter, a spacer stacked layer 228 is formed on the substrate 200. The spacer stacked layer 228 includes a bottom layer 230, an inter-layer 232 and a top layer 234. The etching rate of the inter-layer 232 is different from that of the bottom layer 230 and the top layer 234. In one embodiment, the materials of the bottom layer 230/the inter-layer 232/the top layer 234 include silicon oxide/silicon nitride/silicon oxide, for example, and the thicknesses thereof are 100-300 angstroms/100-300 angstroms/300-700 angstroms. The method of forming the bottom layer 230/the inter-layer 232/the top layer 234 includes performing the CVD process, for example.

Figure 7B:
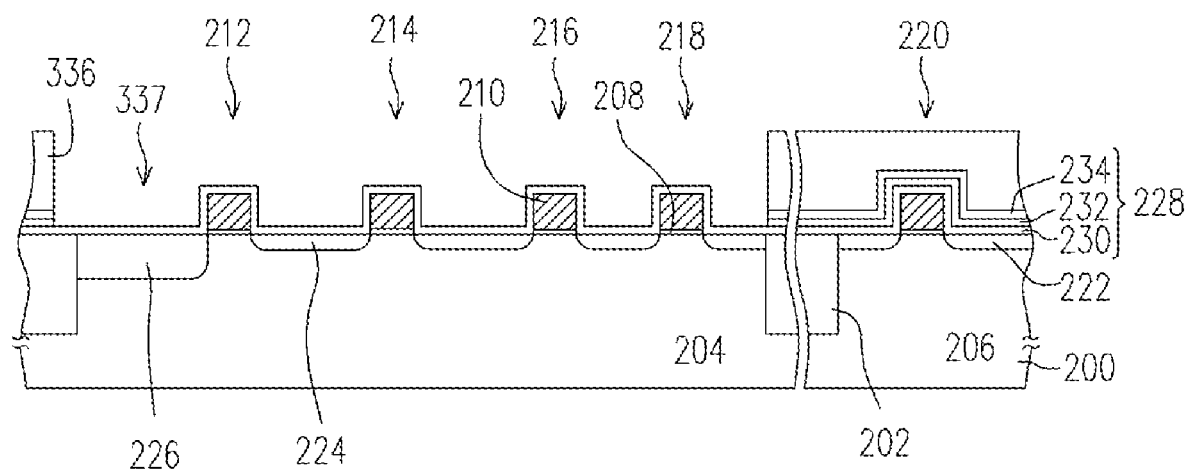

After that, referring to FIG. 7B, a mask layer 336 is formed on the top layer 234. The mask layer 336 has an opening 337 exposing the whole CMOS image sensor region 204. The mask layer 336 is, for example, a patterned photoresist layer, and the method of forming the mask layer 336 includes coating photoresist, performing an exposure process, and implementing a development process.

After that, the top layer 234 and the inter-layer 232 both exposed by the opening 337 are removed with use of the mask layer 336 as a hard mask, such that the bottom layer 230 below the inter-layer 232 is exposed. The method of removing the top layer 234 and the inter-layer 232 may be a dry etching method or a wet etching method.

Figure 7C:
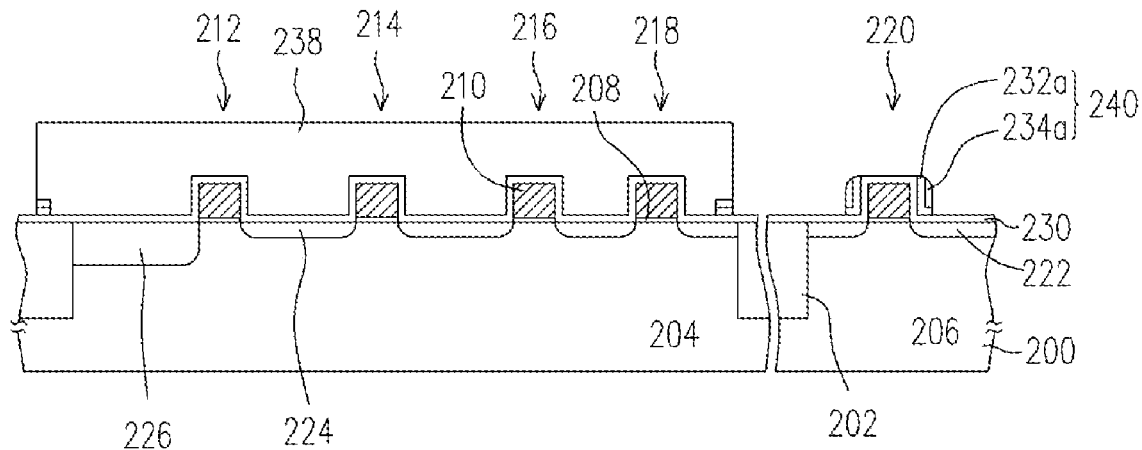

Afterwards, referring to FIG. 7C, the mask layer 336 is removed. Another mask layer 338 is then formed on a region correspondingly exposed by the opening 337, such that the whole CMOS image sensor region 20 is covered while other regions are exposed. The mask layer 338 is, for example, a patterned photoresist layer, and the method of forming the mask layer 338 includes coating photoresist, performing the exposure process, and implementing the development process.

Next, an anisotropic etching operation is performed with use of the mask layer 338 as the mask to remove a portion of the top layer 234 and the inter-layer 232 exposed by the mask layer 338, such that a liner layer 230a is formed at a sidewall of the reset transistor 214, of the source follower transistor 216, and of the select transistor 218, and spacers 240 are formed at two sidewalls of the transistor 220. Each of the spacers 240 is constructed by an inner spacer 232a formed by the inter-layer 232 and an outer spacer 234a formed by the top layer 234. The anisotropic etching operation is a plasma etching process, for example. During the etching process, the photodiode doped region 226 is covered by the mask layer 338, and thus the photodiode doped region 226 is not damaged.

Figure 7D:
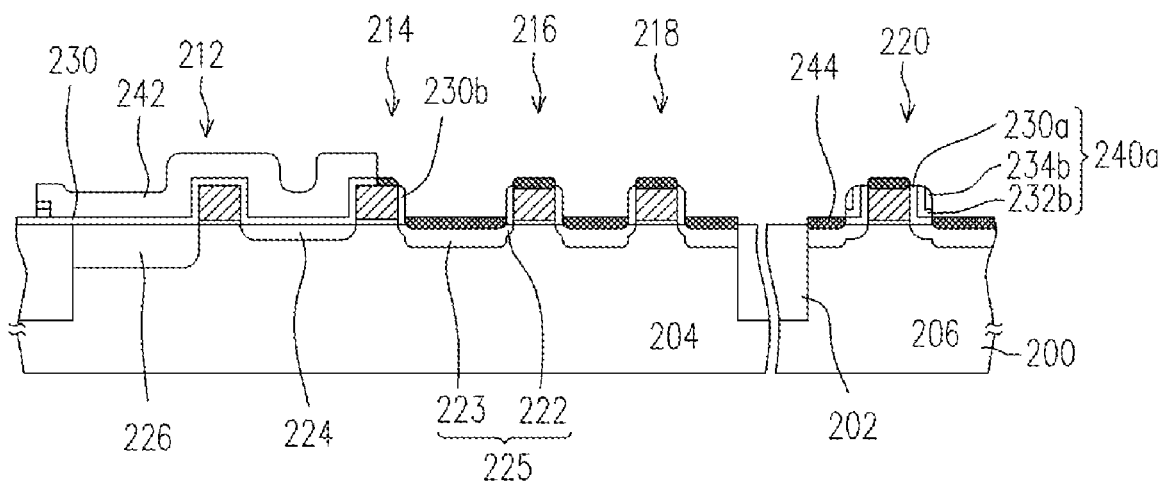

Thereafter, as shown in FIG. 7D, the mask layer 338 is removed. After that, the ion implantation process may be performed to form source/drain contact regions 223 in the substrate 200. The source/drain contact regions 223 and the source/drain extension regions 222 together form source/drain regions 225. Afterwards, an SAB layer 242 is formed on the substrate 200, and the bottom layer 230 exposed by the SAB layer 242 is etched and removed, such that predetermined regions in which a metal silicide layer to be formed are exposed. The material of the SAB layer 242 is, for example, silicon nitride, SiON, or silicon oxide, and the method of forming the SAB layer 242 includes performing the CVD process or an HTO process, for example. In one embodiment, the SAB layer 242 covers the photodiode doped region 226, the transfer transistor 212, the floating node doped region 224, and a part of the gate 210 of the reset transistor 214. During the etching process, the bottom layer 230 covered by the SAB layer 242 is left. The bottom layer 230 exposed by the SAB layer 242 and disposed on the reset transistor 214, the source follower transistor 216, and the select transistor 218 then forms a liner layer 230b at a sidewall of each of the gates 210. The spacers 240 of the transistor 220 exposed by the SAB layer 242 are partially etched to form spacers 240a composed of inner spacers 232b and outer spacers 234b. A liner layer 230a sandwiched between the spacers 240a and the gates 210 is left after the bottom layer 230 is etched. Next, a salicide process is performed to form a metal silicide layer 244 on the gates 210 and on the source/drain regions 225 both exposed by the SAB layer 242. The metal silicide layer 244 is formed by, for example, forming a metal layer on the substrate 200 at first. The metal used for fabricating the metal layer may be a refractory metal selected from one of the groups consisting of nickel, cobalt, titanium, copper, molybdenum, tantalum, tungsten, erbium, zirconium, platinum and an alloy including one or more of said metals. Afterwards, an annealing process is performed to enable the silicon in the substrate 200 or in the gates 210 to react with the metal layer and to form a metal silicide having a lower resistance. Thereafter, the unreacted metal layer is removed.

Thereafter, the successive processes are performed. Since the subsequent processes are well-known to people skilled in the art, detailed descriptions are omitted herein.

In the above fabrication process, a passivation layer (not shown) may be alternatively formed on a surface of the photodiode doped region 226 so as to prevent current leakage. The passivation layer is, for example, a P-doped region.

During the etching and the formation of the spacers, the photodiode doped region is covered by the mask layer. Thus, the photodiode doped region is not damaged, and the dark current is not increased. And the bottom layer left on the photodiode region may become the remained inter-layer or the buffer layer of the anti-reflective layer formed in the subsequent processes. Due to its thin thickness, the subsequently formed anti-reflective layer is extremely close to the photodiode region, which is conducive to suppression of the reflection.

Although the present invention has been disclosed above by the preferred embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A method of fabricating a metal oxide semiconductor (MOS) device, comprising:
    providing a substrate comprising a complementary metal oxide semiconductor (CMOS) image sensor region and a non-CMOS image sensor region;
    forming a plurality of gates and source/drain regions of transistors on the substrate;
    forming a photodiode doped region in the CMOS image sensor region;
    forming a floating node doped region in the CMOS image sensor region;
    forming a spacer stacked layer covering the gate of each of the transistors on the substrate, the spacer stacked layer at least comprising a bottom layer, an inter-layer, and a top layer from bottom to top;
    forming a first mask layer on the substrate, the first mask layer having an opening exposing at least the photodiode doped region of the CMOS image sensor region, the opening being extended to a part of the transistor adjacent to the photodiode doped region;
    performing a removing process through the first mask to remove the top layer and the inter-layer exposed by the opening, thereby to allow the bottom layer to be exposed by the opening;
    removing the first mask layer;
    forming a second mask layer on a region correspondingly exposed by the opening, thereby the second mask layer covering the bottom layer exposed by the opening;
    removing a portion of the top layer and the inter-layer exposed by the second mask layer so as to form a spacer on a sidewall of the gate of each of the transistors exposed by the second mask;
    removing the second mask layer;
    forming a salicide block (SAB) layer on the substrate and removing a portion of the top layer, the inter-layer, and the bottom layer with use of the SAB layer as an etching mask so as to expose a plurality of predetermined regions; and
    forming a metal silicide layer on each of the predetermined regions.

2. The method of fabricating the MOS device of claim 1, wherein the materials of the bottom layer/the inter-layer/the top layer comprise silicon oxide/silicon nitride/silicon oxide.

3. The method of fabricating the MOS device of claim 2, wherein the thicknesses of silicon oxide/silicon nitride/silicon oxide are 300-500 angstroms/100-300 angstroms/300-700 angstroms.

4. The method of fabricating the MOS device of claim 1, wherein the opening exposes the photodiode doped region, the floating node doped region, the transistor adjacent to the photodiode doped region, and a part of the transistor adjacent to the floating node doped region.

5. The method of fabricating the MOS device of claim 1, wherein the opening exposes the whole CMOS image sensor region.

6. The method of fabricating the MOS device of claim 1, wherein the first mask layer comprises a patterned photoresist layer.

7. The method of fabricating the MOS device of claim 1, wherein the second mask layer comprises a patterned photoresist layer.

8. The method of fabricating the MOS device of claim 1, wherein the material of the SAB layer is selected from one of the groups consisting of silicon nitride, SiON, silicon oxide and a combination thereof.

* * * * *